US011836429B2

(12) United States Patent
Sawlani et al.

(10) Patent No.: US 11,836,429 B2
(45) Date of Patent: Dec. 5, 2023

(54) DETERMINATION OF RECIPES FOR MANUFACTURING SEMICONDUCTOR DEVICES

(71) Applicant: Lam Research Corporation, Fremont, CA (US)

(72) Inventors: Kapil Umesh Sawlani, Sunnyvale, CA (US); Atashi Basu, Menlo Park, CA (US); David Michael Fried, Monte Sereno, CA (US); Michal Danek, Cupertino, CA (US); Emily Ann Alden, Portland, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 17/770,944

(22) PCT Filed: Oct. 22, 2020

(86) PCT No.: PCT/US2020/056876
§ 371 (c)(1),
(2) Date: Apr. 21, 2022

(87) PCT Pub. No.: WO2021/081213
PCT Pub. Date: Apr. 29, 2021

(65) Prior Publication Data
US 2022/0374572 A1 Nov. 24, 2022

Related U.S. Application Data

(60) Provisional application No. 62/925,157, filed on Oct. 23, 2019.

(51) Int. Cl.
*G06F 30/3308* (2020.01)
*G06F 30/337* (2020.01)
*G06F 30/27* (2020.01)

(52) U.S. Cl.
CPC .......... *G06F 30/3308* (2020.01); *G06F 30/27* (2020.01); *G06F 30/337* (2020.01)

(58) Field of Classification Search
CPC .... G06F 30/3308; G06F 30/27; G06F 30/337; G06F 2119/18; G06F 30/33; H01L 21/76877; G06N 20/00
See application file for complete search history.

(56) References Cited

U.S. PATENT DOCUMENTS

| 8,571,845 B2 * | 10/2013 | Cao ..................... G03F 7/70458 703/13 |
| 11,216,938 B2 * | 1/2022 | Pu .......................... G06T 5/002 |

(Continued)

FOREIGN PATENT DOCUMENTS

KR 20140130009 A 11/2014

OTHER PUBLICATIONS

"International Application Serial No. PCT US2020 056876, International Preliminary Report on Patentability dated May 5, 2022", 6 pgs.

(Continued)

*Primary Examiner* — Nha T Nguyen
(74) *Attorney, Agent, or Firm* — Schwegman Lundberg & Woessner, P.A.

(57) ABSTRACT

Methods, systems, and computer programs are presented for determining the recipe for manufacturing a semiconductor with the use of machine learning (ML) to accelerate the definition of recipes. One general aspect includes a method that includes an operation for performing experiments for processing a component, each experiment controlled by a recipe, from a set of recipes, that identifies parameters for manufacturing equipment. The method further includes an operation for performing virtual simulations for processing the component, each simulation controlled by one recipe (Continued)

from the set of recipes. An ML model is obtained by training an ML algorithm using experiment results and virtual results from the virtual simulations. The method further includes operations for receiving specifications for a desired processing of the component, and creating, by the ML model, a new recipe for processing the component based on the specifications.

21 Claims, 10 Drawing Sheets

(56) References Cited

U.S. PATENT DOCUMENTS

| | | | | |
|---|---|---|---|---|
| 11,410,290 | B2* | 8/2022 | Ophir | G06N 20/10 |
| 11,562,118 | B2* | 1/2023 | Hsu | G06N 20/00 |
| 2015/0379424 | A1 | 12/2015 | Dirac et al. | |
| 2016/0110657 | A1 | 4/2016 | Gibiansky et al. | |
| 2017/0109646 | A1 | 4/2017 | David | |
| 2017/0193400 | A1 | 7/2017 | Bhaskar et al. | |
| 2018/0174901 | A1* | 6/2018 | Wang | H01L 21/68764 |
| 2019/0269017 | A1* | 8/2019 | Lee | G06F 30/27 |
| 2020/0110390 | A1* | 4/2020 | Banna | H01L 21/67155 |
| 2021/0048741 | A1* | 2/2021 | Lugg | G03F 7/70441 |
| 2021/0109453 | A1* | 4/2021 | Pandev | G06N 20/00 |
| 2021/0116895 | A1* | 4/2021 | Paul | G06F 11/3636 |
| 2021/0116896 | A1* | 4/2021 | Arabshahi | G06N 3/08 |
| 2021/0150387 | A1* | 5/2021 | Rothstein | G03F 7/705 |
| 2022/0344164 | A1* | 10/2022 | Nakamura | B24B 51/00 |

OTHER PUBLICATIONS

International Application Serial No. PCT/US2020/056876, International Search Report dated Jan. 29, 2021, 4 pgs.
International Application Serial No. PCT/US2020/056876, Written Opinion dated Jan. 29, 2021, 4 pgs.

* cited by examiner

DETERMINATION OF RECIPES FOR MANUFACTURING SEMICONDUCTOR DEVICES

CLAIM OF PRIORITY

This application is a U.S. National Stage Filing under 35 U.S.C. 371 from international Application No. PCT/US2020/056876, filed on Oct. 22, 2020, and published as WO 2021/081213 A1 on Apr. 29, 2021, which claims priority from U.S. Provisional Patent Application No. 62/925,157, filed Oct. 23, 2019, and entitled "Determination of Recipe for Manufacturing Semiconductor," each of which is herein incorporated by reference in its entirety.

RELATED APPLICATION

This application is related to U.S. patent application Ser. No. 16/260,870, filed Jan. 29, 2019, and entitled "Fill Process Optimization Using Feature Scale Modeling," which is incorporated herein by reference in its entirety.

TECHNICAL FIELD

The subject matter disclosed herein generally relates to methods, systems, and machine-readable storage media for manufacturing semiconductors.

BACKGROUND

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Chemical reactors used in deposition process development of semiconductors chips tend to have many interdependent sub-systems (e.g., sensors, actuators, gas feeds, power sources, matching networks). These sub-systems are controlled independently by process parameters that follow a set of instructions included in a recipe for a control system. The behavior of these sub-systems collectively determines the output performance on a product wafer.

The increasing complexity of modern process equipment means that the number of components in the system increases to manage this complexity, thereby increasing the number of process "knobs" (e.g., adjustable processing parameters) in the system. The various system states (pressure, temperature, flow set points, etc.) are factors that play a role in the desired output on the wafer such as step coverage of a film, non-uniformity of the film, etch depth, etc.

Properly setting the process parameter values is a key challenge in the semiconductor equipment industry and often leads to weeks or months of process development time to obtain a recipe that can set all these process parameters to obtain components that meet the desired qualification metrics.

SUMMARY

Methods, systems, and computer programs are presented for determining the recipe for manufacturing a semiconductor with the use of machine learning (ML) to accelerate the definition of recipes. One general aspect includes a method that includes an operation for performing experiments for processing a component, each experiment controlled by a recipe, from a set of recipes, that identifies parameters for manufacturing equipment. The method further includes an operation for performing virtual simulations for processing the component, each simulation controlled by one recipe from the set of recipes. An ML model is obtained by training an ML algorithm using experiment results and virtual results from the virtual simulations. The method further includes operations for receiving specifications for a desired processing of the component, and creating, by the ML model, a new recipe for processing the component based on the specifications.

BRIEF DESCRIPTION OF THE DRAWINGS

Various ones of the appended drawings merely illustrate example embodiments of the present disclosure and cannot be considered as limiting its scope.

DETAILED DESCRIPTION

Example methods, systems, and computer programs are directed to determining the recipe for manufacturing a semiconductor. Examples merely typify possible variations. Unless explicitly stated otherwise, components and functions are optional and may be combined or subdivided, and operations may vary in sequence or be combined or subdivided. In the following description, for purposes of explanation, numerous specific details are set forth to provide a thorough understanding of example embodiments. It will be evident to one skilled in the art, however, that the present subject matter may be practiced without these specific details.

Figure 1:
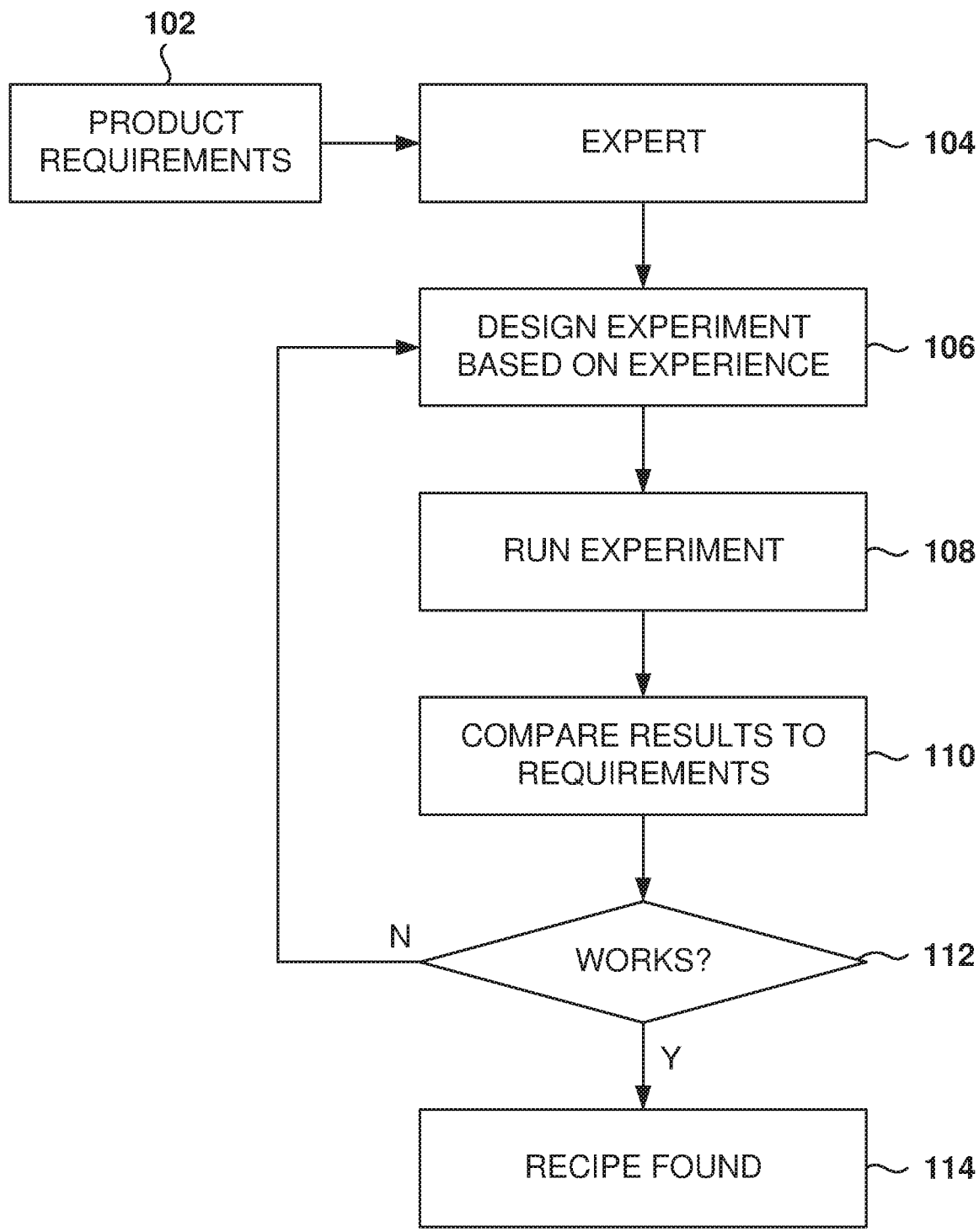
FIG. 1 shows a process for finding a semiconductor manufacturing recipe, according to some example embodiments.

FIG. 1 shows a process for finding a semiconductor manufacturing recipe, according to some example embodiments. The current approach for recipe development is based on historic learning from subject matter experts in process engineering teams.

Product requirements 102 are given to the expert 104 that designs (operation 106) an experiment based on past experience. One example of product requirements 102 is the amount of deposition desired on a feature.

The experiment includes a recipe created by the expert 104 based on the product requirements 102. However, finding the right recipe may be a daunting process, especially when product requirements may be in the order of 1-nm accuracy.

The experiment is run 108 in the lab and the results are measured and compared 110 to the original product requirements 102. Some example result metrics include uniform-layer thickness and resistivity of conductors.

A check 112 is made to determine if the results are adequate to match the product requirements 102. If the results are adequate, then the recipe is found 114, and if the results are not adequate, the method flows back to operation 106 where the expert tweaks the recipe based on the results in order to improve the recipe to get closer to the product requirements 102.

As the number of processing parameters in the system increases, it becomes progressively difficult to truly isolate and study the impact of individual factors and their impact on the desired results. Manufacturing tools are complex and have many configurable parameters, such as gas flows, plasma properties, thermal properties, etc. For example, a typical atomic layer deposition (ALD) process has 100-200 tunable parameters.

Standard experimental techniques such as single variable tests (SVTs) and statistical design of experiments (DOEs) (e.g., full factorial, screening design, response surface model, mixture models, Taguchi arrays) allow determining the impact of experiment factors on the result, as well as studying the correlation between different factors. However, these methods require many experiments to determine the effects of various processing parameters. To obtain a nearly perfect recipe, a process engineer or team of process engineers typically spends several weeks (or months), and it requires conducting many tests, which raises the cost of wafer development.

Further, when testing for one parameter, there is no optimization for other parameters, and the experiment may run into a local minima, which will stop the expert from developing the recipe in the right direction if multiple parameters were addressed together.

A limitation of this methodology is that it is very manual, requires extensive tool time for running tests and performing metrology, and additional time for analysis to make subsequent changes for the next rounds of testing. This results in multiple cycles of learning, which in some complex cases can be several months. Usually the factors considered for an experiment do not include all possible variables and the model's correlation coefficient suggest the degree of predictability of the model. While blocking designs and screening designs exist to test more factors in an experimental setting, this requires expertise in planning the experimental setup. The ultimate result is the same; many tests are required, which is expensive and time consuming.

Figure 2:
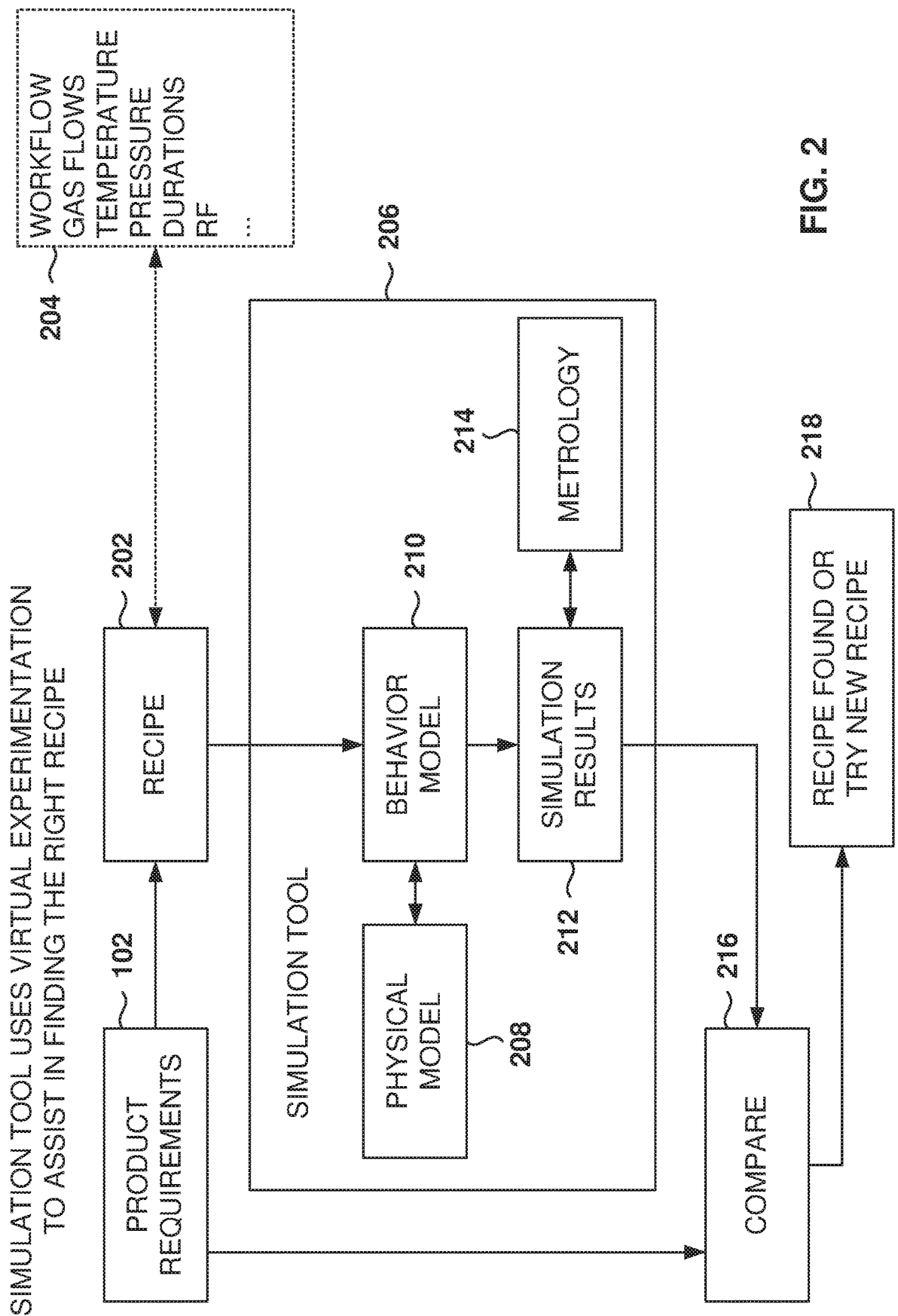
FIG. 2 illustrates the use of a simulation tool for conducting a virtual experiment using a recipe, according to some example embodiments.

FIG. 2 illustrates the use of a simulation tool for conducting a virtual experiment using a recipe, according to some example embodiments. Embodiments presented herein describe methods for finding process recipes using machine learning (ML) and a simulation tool 206.

To minimize the cost incurred for physical testing and associated metrology, as well as to speed up process development time (reduce cycles of experimentation and learning), simulation of the process is used to test example recipes 202. One example simulation tool is SEMulator3D from Lam Research which provides a voxel model of a semiconductor process based on the expected behavior as simulated by a behavior model 210. However, the same principles may be applied with other simulation tools.

The behavior model 210 describes the output of the process based on an analytical formulation. The behavior model 210 qualitatively captures the process but does not provide guidance to the process development in terms of quantities that define the process parameters.

For example, for a deposition process, there are two surfaces B with selective deposition in one of the two surfaces and not on the other one. The model measures the deposition thickness throughout the surfaces. For example, there is a deposition thickness of 0.72 in some areas and 0.71 in another area. The behavior model does not look into the behavior of particles within the chamber, but rather measures the results of the operations (e.g., deposition thickness).

As an example, an ALD system may have hundreds of parameters 204 that define the recipe 202. A non-exhaustive list of these parameters 204 includes common tool parameters (e.g., number of ALD cycles, presence of soak, operation mode of tool, etc.), flow parameters (e.g., flowrate of various gases, flow concentrations, dilution gases, non-reactive gases for station isolation, etc.), chamber conditioning or precoat parameters (e.g., precoat temperature, precoat time, etc.), pressure parameters (e.g., chamber pressure, reservoir pressures, throttle valve angles, precursor ampoule pressure, vacuum clamping pressure, etc.), nucleation chemistry parameters (e.g., dose times, dose flows, chemistry concentration, cycles, etc.), temperature parameters (e.g., pedestal temperatures, ampoule temperatures, chamber temperatures, showerhead temperatures, etc.). ALD timing parameters (e.g., precursor A dose time, purge time, precursor B dose time, pre-heat time, etc.), and other miscellaneous parameters. These parameters may be used as features for the ML model, as described below with reference to FIG. 4.

In some instances, there is a linear dependency of the parameters on the predicted output, whereas in certain cases there is a non-linear dependency. Predicting these dependencies and building appropriate models is non-trivial. Further, the approaches used today do not account for geometry dependence (i.e., upstream process integration steps).

The simulation tool 206 builds a three-dimensional model of what will happen on a substrate if the recipe 202 were run through the process, and the simulation tool 206 generates simulation results, which are measured by metrology 214. The metrology 214 provides measurements of the simulation results 212, and the metrology 214 includes items such as layer thickness, resistivity, etc. Image analysis may be used to examine the simulation results 212, but other types of metrology 214 may also be used.

The physical model 208 is a description of the physical operations on the substrate and are typically based on first principles but may also be empirically driven using ML and statistical methods with a foundation based on physics and chemistry.

The physical model 208 takes into account chamber parameters, such as pressure, temperature, flux of species (number of particles crossing a unit area surface per second), etc. The physical model 208 analyzes these parameters to predict the behavior of physical particles (e.g., flux of species) that affect the process. For example, the flux value affects the deposition thickness, as higher flux values mean higher deposition thickness than lower flux values. These parameters may be used as features for the ML model, as described below with reference to FIG. 4.

In some example embodiments, the bridge linking the behavior model 210 and the real-world process recipes via the physical model 208 is generated by some correlation methods. These correlation methods include multi-variate regression methods, neural networks, decision trees, Support Vector Machines (SVM), etc. In some example embodiments, the physical model 208 may be a combination of a plurality of models that address different aspects of the physical model. Further, in some example embodiments, the behavior model 210 may be a combination of a plurality of models where each model covers a different behavioral aspect.

The simulation tool 206 utilizes the behavior model 210 and the physical model 208 to generate the simulation results 212, also referred to as virtual results since the experiments are not actually performed.

The simulation results 212 are compared to the product requirements 102 to determine if the recipe 202 would satisfy the product requirements 102. If the simulation results 212 are satisfactory, then a working recipe has been found. Otherwise, a new simulation can be performed, with a different recipe 202, to continue searching for the right recipe 202.

Successful simulations mean fewer tests, which translate into time savings and cost savings. For unsuccessful simulations, the results can be fed back into the model to improve accuracy in future predictions.

Figure 3:
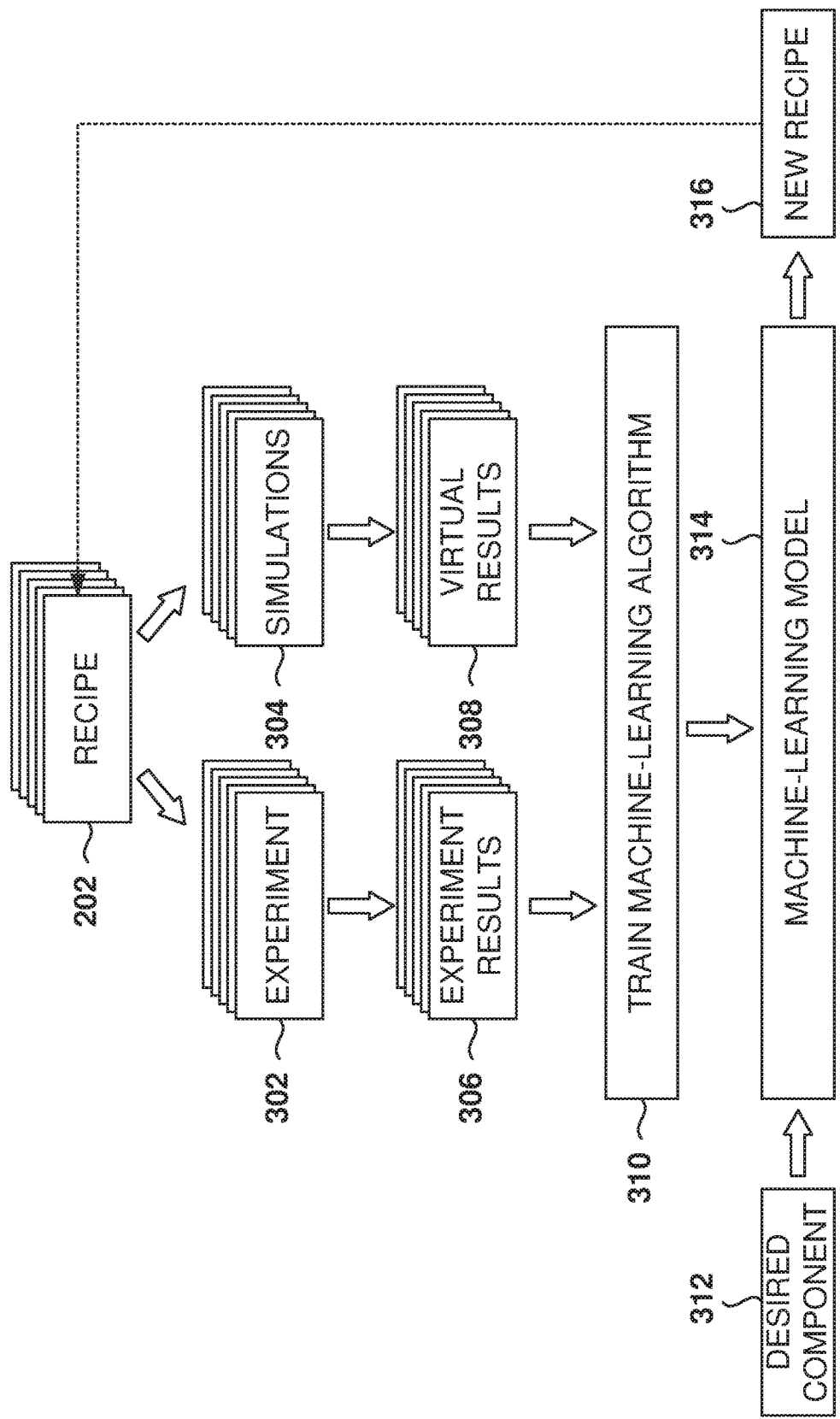
FIG. 3 illustrates the use of machine learning to accelerate the definition of recipes, according to some example embodiments.

FIG. 3 illustrates the use of machine learning to accelerate the definition of recipes, according to some example embodiments. ML is an application that provides computer systems the ability to perform tasks, without explicitly being programmed, by making inferences based on patterns found in the analysis of data. ML relies on data to be able to learn from the data in order to make the inferences.

In some example embodiments, data for ML includes experiment results 306, resulting from actual experiments 302 performed on the semiconductor manufacturing tool, and virtual results 308 resulting from simulations 304. The experiments 302 and the simulations 304 may use the same or different recipes 202. The method can be applied to multiple semiconductor-manufacturing operations, such as depositions, etch, and cleaning.

Running actual experiments 302 is expensive and time consuming. However, running simulations 304 is much faster and less expensive. Therefore, many simulations 304 may be run (e.g., from ten to one thousand or more) to obtain many virtual results 308 that can be used for training the machine-learning algorithm. For example, simulations 304 may be run by changing values for parameters of interest in order to be able to predict how these parameters of interest can be adjusted to create the new recipe 316.

At operation 310, the ML algorithm is trained with the data from the experiment results 306 and the virtual results 308. The result of the training in operation 310 is the ML model 314 that is configured to receive a desired component 312 (e.g., product requirements) and generate the new recipe 316. In some example embodiments, the number of experiments is in the range from 10 to 100, although other values are also possible. Further, the number of simulations 304 is in the range from 100 to 100,000, although other values are also possible.

In some example embodiments, the experiment results 306 are given a higher weight than the virtual results 308 for the training (operation 310) because there may be fewer experiment results 306, and the actual experiment results 306 are more accurate than the virtual results 308 obtained from simulations 304. Further, other data may be used for the training, such as data obtained from a library of experiments. More details about ML are provided below with reference to FIG. 5A.

Several iterations of the ML model 314 may be used in the search for the best recipe that satisfies the product requirements 102. The new recipe 316 can be used for experiments (real or virtual) and the data used to train the ML algorithm in order to improve the accuracy of the ML model 314.

Embodiments presented herein link chamber setpoints and sensor data towards the simulator behavioral models that are calibrated based on real metrology data (image data, film properties data, etc.). In some example embodiments, using prior knowledge towards determining new design space may be possible with methods such as Bayesian inference. Further, guidance from physics-based modeling can be used in conjunction with behavior models to further improve accuracy in the correlation process of process parameters and model outputs.

The influence of process parameters on process performance is inferred based on virtual model results. This not only speeds up understanding of the process based on models but also correlates the process to tool parameters, which can be easily understood by process engineers and technicians and translated for process optimization on the tool. As a result, the proposed solution reduces experimental costs and time. Fewer iterations results in higher operational efficiency.

In some example embodiments, different ML models 314 are used for different semiconductor-manufacturing operations. For example, one ML model is created for deposition operations (e.g., using experiments and simulations for depositions), another model for etching operations, another one for cleaning substrates, etc.

One of the benefits of the ML model 314 is that it is possible to explore behavior parameters as well as physical parameters in the search for the new recipe 316.

One example application is for deposition using an inhibition profile. Calibrated behavior models from behavior tuning of dep-inhibit-dep models or dep-etch-dep models are described in U.S. patent application Ser. No. 16/260,870, filed Jan. 29, 2019, and entitled "Fill Process Optimization Using Feature Scale Modeling," which is incorporated herein by reference. The calibrated behavior models are correlated to the experimental variables such as dose time, purge time, flow rates of various inhibiting chemistries, system pressure, wafer temperature, molecular transport per incoming feature geometry, etc. These variables from the test set (small batch of samples run experimentally) are used to train an ML model that bridges the gap between process results and simulation behavior based on one or more ML models that are calibrated using optimization methods such as gradient descent. Key parameters that have high influence on the process are extracted and experimentally validated to get the ideal recipe based on the sample space the model is calibrated on. This model takes into account the geometry of the structure, which is often overlooked in other methods of analysis more details about. More details about this process are provided below with reference to FIG. 6.

Another deposition example is for 3D NAND WL (word line) fill and roughness control, where the reacting species in an ALD system have to travel not only the entire length of a high-aspect ratio (HAR) structure, but also flow laterally to inner WLs. In addition to the challenges associated with molecular transport, these processes are typically done very quickly (less than a second per cycle for the following steps: precursor dose-purge-reducing agent dose-purge) to match customer expected throughput.

Roughness due to grain growth may result in pinch off and void formation and can be modulated by inhibiting growth in certain regions. The model predicts the behavior of the profiles based on reaction diffusion model in vertical and lateral structures. Experimental data allows for calibrating the model and relating it to the tool parameters such as precursor dose time, chemistry purge time, reducing agent dose time, inhibiting molecule dose time, system pressure, wafer temperature, and the geometry of the structure as modeled in the simulator. Based on a sample set used for training data, an ML model is used to relate the result of the optimized solution (e.g., void-free film, low-roughness film, potential etch back post deposition, etc.) based on the process parameters.

Figure 4:
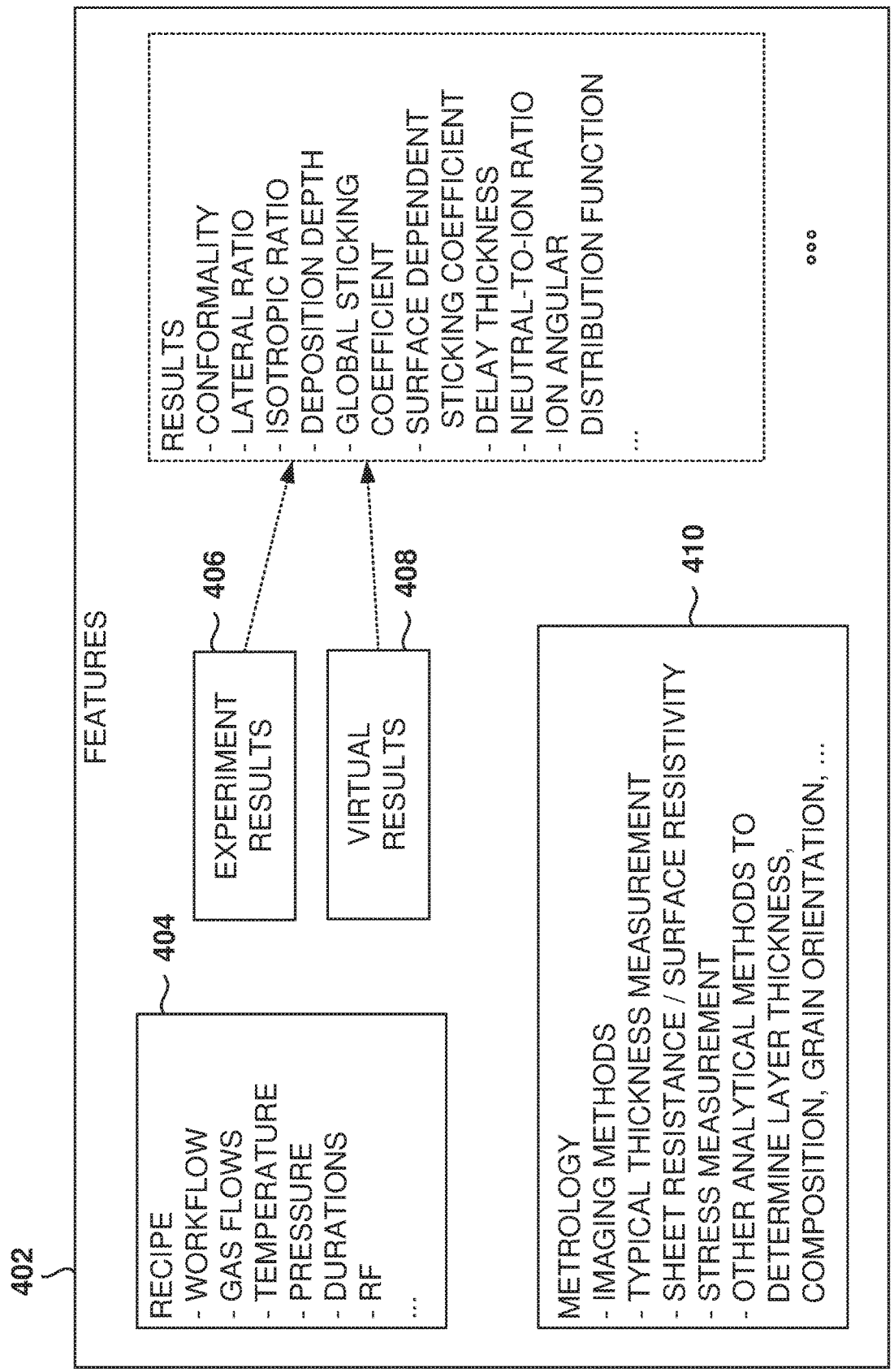
FIG. 4 shows some of the features used by the machine-learning program, according to some example embodiments.

FIG. 4 shows some of the features 402 used by the machine-learning program, according to some example embodiments. Features are used by ML algorithms to represent the data. A feature is an individual measurable property of a phenomenon being observed. The concept of a feature is related to that of an explanatory variable used in statistical techniques such as linear regression. Choosing informative, discriminating, and independent features is important for effective operation of ML in pattern recognition, classification, and regression. Features may be of different types, such as numeric features, strings, and graphs.

In some example embodiments, the features 402 for the ML algorithms, used to find process recipes, include recipe features 404, experiment-result features 406, virtual-results features 408, and metrology features 410. Other models may use additional features or only a subset of these features.

The recipe features 402 include parameters associated with the recipe, such as workflow, gas flows, chamber temperature, chamber pressure, step durations, radiofrequency (RF) values (e.g., frequencies, voltages), etc.

The experiment-result features 406 and the virtual-result features 408 include values measured from the resulting semiconductor, such as conformality, lateral ratio, isotropic ratio, deposition depth, global sticking coefficient, surface dependent sticking coefficient, delay thickness, neutral-to-ion ratio, ion angular distribution function, etc.

The metrology features 410 include metrics used by metrology, such as Imaging Methods (e.g., Scanning Electron Microscopy (SEM)), Transmission Electron Microscopy (TEM)), typical-thickness measurement (e.g., X-Ray Fluorescence (XRF), Ellipsometry), sheet resistance, surface resistivity, stress measurement, and other analytical methods used to determine layer thickness, composition, grain orientation, etc. These other analytical methods include one or more of X-Ray Diffraction (XRD), X-Ray Reflectivity (XRR), Precession Electron Diffraction (PED), Electron Energy Loss Spectroscopy (EELS), Energy Dispersive x-ray Spectroscopy (EDS), Secondary Ion Mass Spectroscopy (SIMS), etc.

In some example embodiments, the metrology includes time-series data, which includes sensor measurements taken over time for a given parameter, such as how the pressure in the chamber evolves over time during the manufacturing process.

Figure 5A:
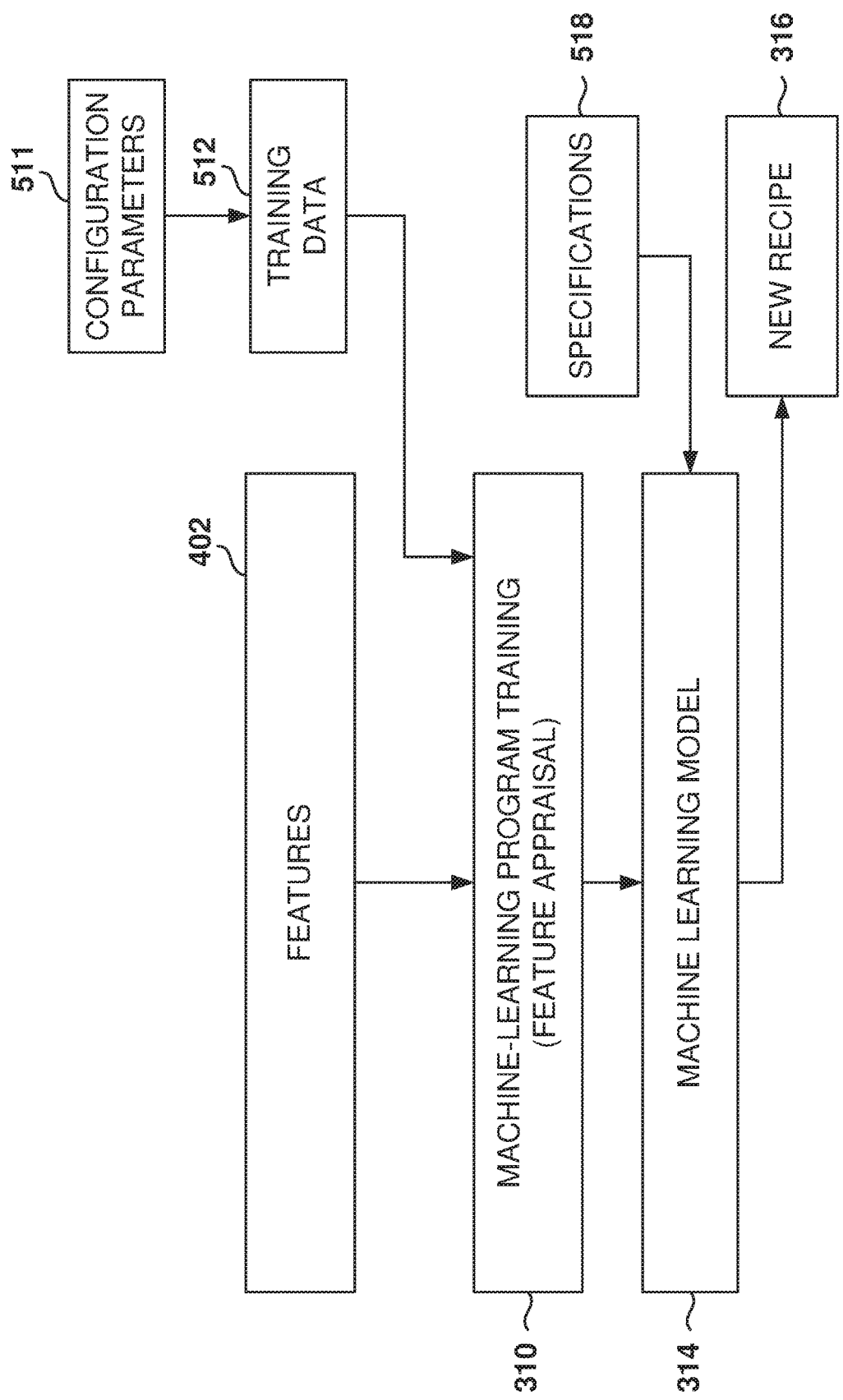
FIG. 5A illustrates the training and use of the machine-learning program, according to some example embodiments.

FIG. 5A illustrates the training and use of the machine-learning program, according to some example embodiments. In some example embodiments, machine-learning programs (MLPs), also referred to as machine-learning algorithms or tools, are utilized to perform operations associated with determining the recipe for manufacturing a semiconductor.

Machine learning explores the study and construction of algorithms, also referred to herein as tools, that may learn from existing data and make predictions about new data. Such machine-learning algorithms operate by building an ML model 314 from example training data 512 in order to make data-driven predictions or decisions expressed as outputs or assessments, such as finding a new recipe 316. Although example embodiments are presented with respect to a few machine-learning tools, the principles presented herein may be applied to other machine-learning tools.

There are two common modes for ML: supervised ML and unsupervised ML. Supervised ML uses prior knowledge (e.g., examples that correlate inputs to outputs or outcomes) to learn the relationships between the inputs and the outputs. The goal of supervised ML is to learn a function that, given some training data, best approximates the relationship between the training inputs and outputs so that the ML model can implement the same relationships when given inputs to generate the corresponding outputs. Unsupervised ML is the training of an ML algorithm using information that is neither classified nor labeled, and allowing the algorithm to act on that information without guidance. Unsupervised ML is useful in exploratory analysis because it can automatically identify structure in data.

Common tasks for supervised ML are classification problems and regression problems. Classification problems, also referred to as categorization problems, aim at classifying items into one of several category values (for example, is this object an apple or an orange?). Regression algorithms aim at quantifying some items (for example, by providing a score to the value of some input). Some examples of commonly used supervised-ML algorithms are Logistic Regression (LR), Naive-Bayes, Random Forest (RF), neural networks (NN), deep neural networks (DNN), matrix factorization, and Support Vector Machines (SVM).

Some common tasks for unsupervised ML include clustering, representation learning, and density estimation. Some examples of commonly used unsupervised-ML algorithms are K-means clustering, principal component analysis, and autoencoders.

In some embodiments, example machine-learning algorithms determine a new recipe 316 for manufacturing a semiconductor. The machine-learning algorithms utilize the training data 512 to find correlations among identified features 402 that affect the outcome. In one example embodiment, the features may be of different types and may include the features 402 described above with reference to FIG. 4.

During the training operation 310, the ML algorithm analyzes the training data 512 based on identified features 402 and configuration parameters 511 defined for the training. The result of the training operation 310 is an ML model 314 that is capable of taking inputs to produce assessments.

Typically, training an ML algorithm involves analyzing large amounts of data (e.g., from a gigabyte to a terabyte or more) in order to find data correlations. The ML algorithms utilize the training data 512 to find correlations among the identified features 402 that affect the outcome or assessment (e.g., the new recipe 316). In some example embodiments, the training data 512 includes labeled data, which is known data for one or more identified features 402 and one or more outcomes, such as the metrology measurements.

The ML algorithms usually explore many possible functions and parameters before finding what the ML algorithms identify to be the best correlations within the data, therefore, training may require large amounts of computing resources and time.

Many ML algorithms include configuration parameters 511, and the more complex the ML algorithm, the more parameters 511 there are that are available to the user. The configuration parameters 511 define variables for an ML algorithm in the search for the best ML model. The configuration parameters include model parameters and hyperparameters. Model parameters are learned from the training data, whereas hyperparameters are not learned from the training data, but instead are provided to the ML algorithm.

Some examples of model parameters include maximum model size, maximum number of passes over the training data, data shuffle type, regression coefficients, decision tree split locations, and the like.

In some example embodiments, representative model parameters are scalar or context attributes. An example of a scalar attribute is a physical or behavioral model parameter that has been determined, such as a deposition rate or the depth of inhibition. Further, a context attribute is an attribute that depends on other attributes (e.g., the context), and may include physical, statistical, and machine-learning-derived relationships. In particular, a physical context could be the deposition rate with respect to the aspect ratio.

Examples of a statistical context include parameter reductions using principal component analysis (PCA) or linear discriminant analysis (LDA). PCA is a dimensionality-reduction method used to reduce the dimensionality of large data sets by transforming a large set of variables into a smaller set that still contains most of the information in the large set. Because smaller data sets are easier to explore and visualize and make analyzing data much easier and faster for machine earning algorithms without extraneous variables to process.

Linear discriminant analysis (LDA) is a method used to find a linear combination of features that characterizes or separates two or more classes of objects or events. The resulting combination may be used as a linear classifier, or for dimensionality reduction before classification.

Examples of machine learning derived context are autoencoders, neural networks, or trained regressors. When these scalar or context attributes have been validated as representative of the experimental data, they are representative model parameters and are used as inputs to subsequent modelling work. When these parameters are the product of simulation work, they are referred to as "virtual results" or "simulation results."

Hyperparameters may include the number of hidden layers in a neural network, the number of hidden nodes in each layer, the learning rate (perhaps with various adaptation schemes for the learning rate), the regularization parameters, types of nonlinear activation functions, and the like. Finding the correct (or the best) set of hyperparameters can be a very time-consuming task that requires a large amount of computer resources.

When the ML model 314 is used to perform an assessment, specifications 518 are provided as an input to the NIL model 314, and the ML model 314 generates the new recipe 316 as output.

Figure 5B:
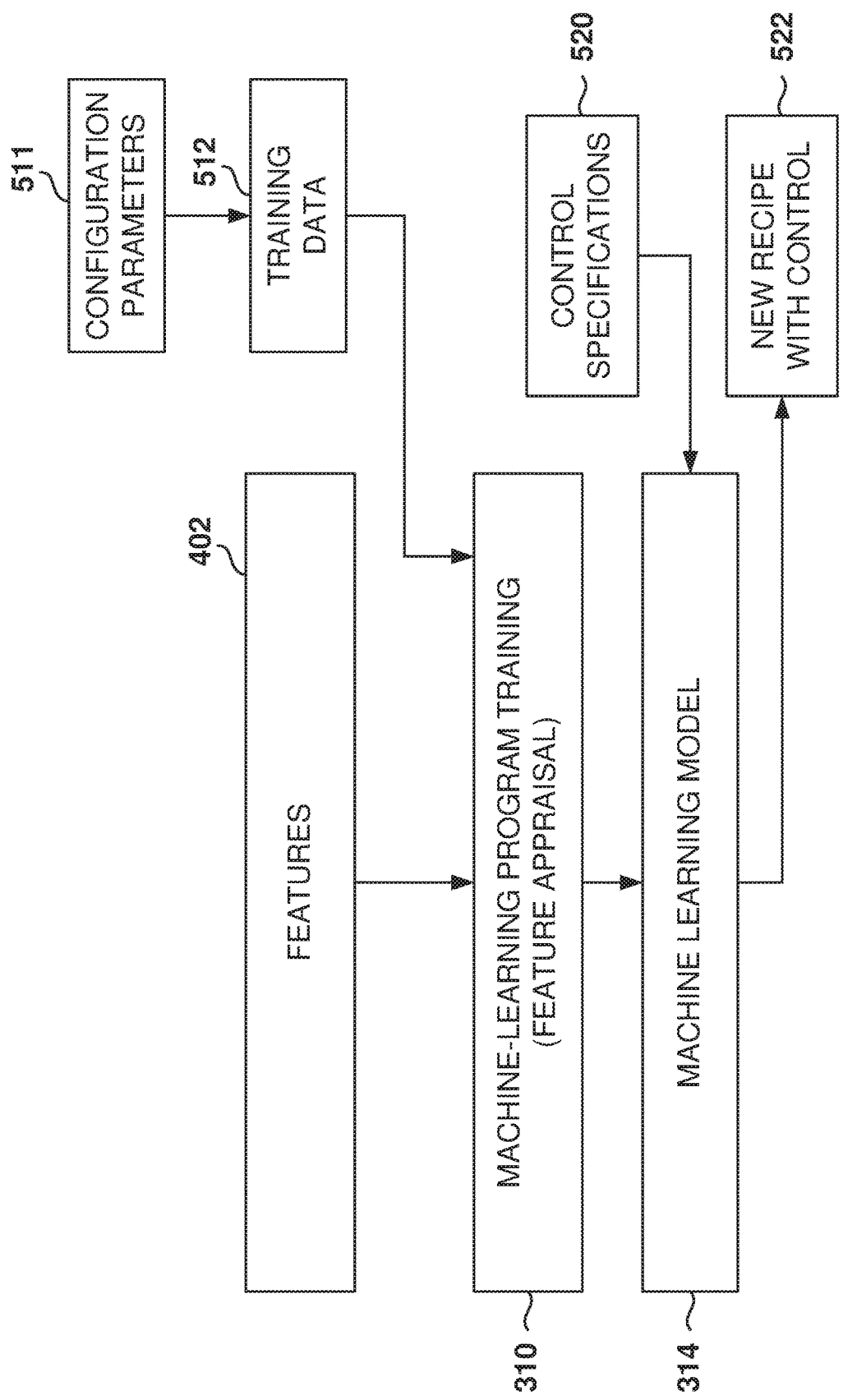
FIG. 5B illustrates the use of the machine-learning program with active process control, according to some example embodiments.

FIG. 5B illustrates the use of the machine-learning program with active process control, according to some example embodiments. In some example embodiments, an objective of the final recipe is active process control. Active process control is a process correction method to compensate for incoming, downstream, or environmental variations. For example, in response to previous outputs when working with a certain structure, the number of deposition cycles can be increased to compensate for work to be done on a for a larger structure.

The trained ML model 314 can be deployed to determine which process parameters will satisfy the control objectives. The input 520 includes the control specifications for the recipe and the desired active process control. The resulting new recipe with control parameters 522 will contain setpoints that depend on the local control requirement at process runtime.

Figure 6:
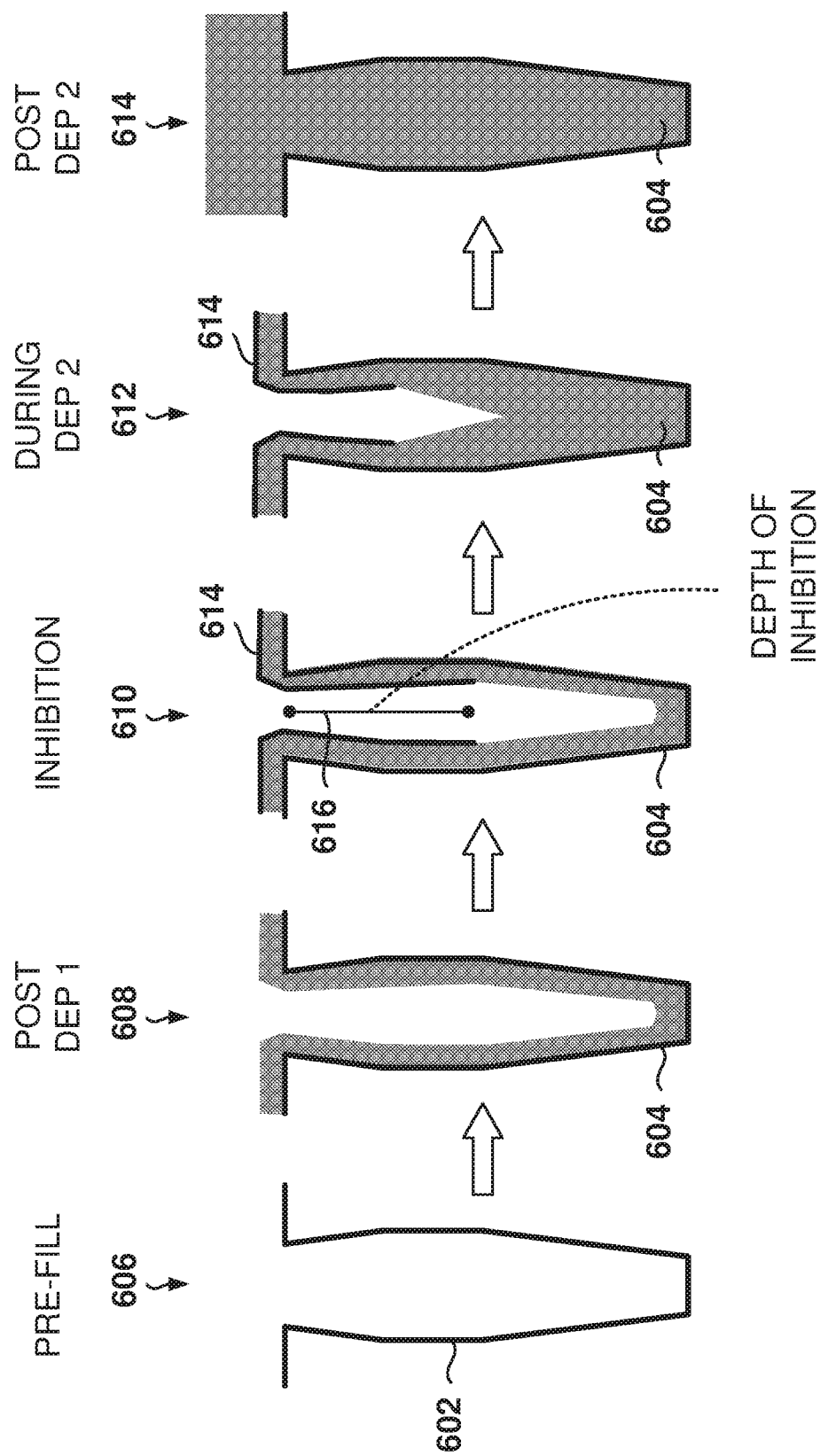
FIG. 6 shows an example of a deposition-inhibition-deposition (DID) deposition process, using an inhibition-controlled-enhanced (ICE) fill, that may be optimized using behavior models.

FIG. 6 shows an example of a deposition-inhibition-deposition (DID) deposition process, using an inhibition-controlled-enhanced (ICE) fill, that may be optimized using behavior models. In some example embodiments, behavioral models employ abstractions of processes to predict structural details of components produced by one or more semiconductor device fabrication operations. Examples of behavioral models are presented in U.S. Pat. Nos. 9,015,016 and 9,659,126, incorporated by reference herein.

An unfilled component 602 is shown at a pre-fill stage 606. The component 602 may be formed in one or more layers on a semiconductor substrate and may optionally have one or more layers that line the sidewalls and/or the bottom of the component 602. The goal is to avert voids within the fill of the component 602.

At stage 608, the component 602 is shown after an initial deposition of the fill material to form a layer of the material 604 to be filled in the component 602. Examples of material 604 include tungsten, cobalt, molybdenum, and ruthenium, though the techniques described herein may be used to optimize fill of any appropriate material 604 including other conductors and dielectrics such as oxides (e.g., $SiO_x$, $AbO_3$), nitrides (e.g., SiN, TiN) and carbides (e.g., SiC).

At stage 610, the component 602 is shown after an inhibition treatment. The inhibition treatment is a treatment that has the effect of inhibiting subsequent deposition on the treated surfaces 614. The inhibition may involve various mechanisms depending on various factors including the surfaces to be treated, the inhibition chemistry, and whether the inhibition is a thermal or plasma process. In one example, tungsten nucleation, and thus tungsten deposition, is inhibited by exposure to a nitrogen-containing chemistry. This can involve generation of activated nitrogen-containing species by a remote or direct plasma generator, for example, or exposure to ammonia vapor in an example of a thermal (non-plasma) process.

Examples of inhibition mechanisms can include a chemical reaction between activated species and the component surface to form a thin layer of a compound material such as tungsten nitride (WN) or tungsten carbide (WC). In some embodiments, inhibition can involve a surface effect such as adsorption that passivates the surface without forming a layer of a compound material.

The inhibition may be characterized by an depth of inhibition 616 and an inhibition gradient; that is, the inhibition may vary with depth, such that the inhibition is greater at the component 602 opening than at the bottom of the component 602 and may extend only partway into the component 602. In the depicted example, the depth of inhibition 616 is about half of the full component 602 depth. In addition, the inhibition treatment is stronger at the top of the component 602. Because deposition is inhibited near the component 602 opening, during a second deposition stage Dep 2 612, the material preferentially deposits at the component 602 bottom while not depositing or depositing to a less extent at the component 602 opening. This can prevent the formation of voids and seams within the filled component 602. As such, during the second deposition Dep 2 stage 612, the material 604 may be filled in a manner characterized as bottom-up fill rather than the conformal first deposition Dep 1 fill.

As the deposition continues, the inhibition effect may be removed, such that deposition on the lightly treated surfaces may no longer be inhibited. This is illustrated at stage 612, with the treated surfaces 614 being less extensive than prior to the Dep-2 stage. In the illustrated example, as the second deposition Dep 2 proceeds, the inhibition is eventually overcome on all surfaces and the component is completely filled with the material 604 as shown at stage 614.

Although only one inhibition cycle is shown, the process may include several deposition and inhibition cycles. Behavioral modeling is used to fine tune the recipe to control the deposition and inhibition parameters such that voids in the fill are eliminated and the filled material meets requirements. Metrology is used to measure the different metrics for deposition and inhibition, including the appearance of voids in the fill.

Figure 7:
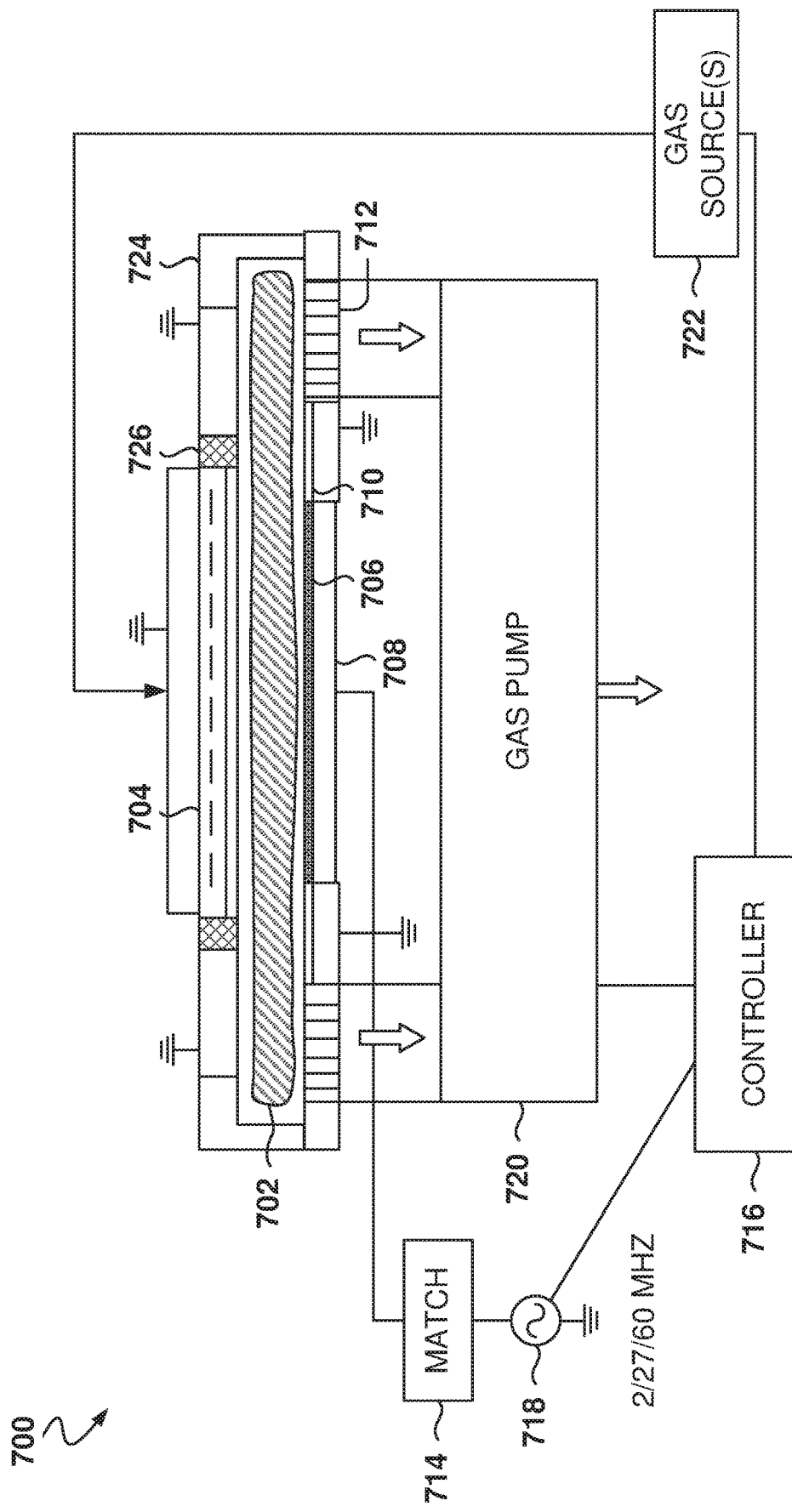
FIG. 7 is an etching chamber, according to some example embodiments.

FIG. 7 is an etching chamber 700, according to one embodiment. Exciting an electric field between two electrodes is one of the methods to obtain radiofrequency (RF) gas discharge in an etching chamber. When an oscillating voltage is applied between the electrodes, the discharge obtained is referred to as a Capacitive Coupled Plasma (CCP) discharge.

Plasma 702 may be created utilizing stable feedstock gases to obtain a wide variety of chemically reactive by-products created by the dissociation of the various molecules caused by electron-neutral collisions. The chemical aspect of etching involves the reaction of the neutral gas molecules and their dissociated by-products with the molecules of the to-be-etched surface, and producing volatile molecules, which can be pumped away. When plasma is created, the positive ions are accelerated from the plasma across a space-charge sheath separating the plasma from chamber walls to strike the wafer surface with enough energy to remove material from the wafer surface. This is known as ion bombardment or ion sputtering. Some industrial plasmas, however, do not produce ions with enough energy to efficiently etch a surface by purely physical means.

A controller 716 manages the operation of the chamber 700 by controlling the different elements in the chamber 700, such as RF generator 718, gas sources 722, and gas pump 720. In one embodiment, fluorocarbon gases, such as $CF_4$ and $C-C_4F_8$, are used in a dielectric etch process for their anisotropic and selective etching capabilities, but the principles described herein can be applied to other plasma-creating gases. The fluorocarbon gases are readily dissociated into chemically reactive by-products that include smaller molecular and atomic radicals. These chemically reactive by-products etch away the dielectric material, which in one embodiment can be $SiO_2$ or SiOCH for low-k devices.

The chamber 700 illustrates a processing chamber with a top electrode 704 and a bottom electrode 708. The top electrode 704 may be grounded or coupled to an RF generator (not shown), and the bottom electrode 708 is coupled to RF generator 718 via matching network 714. RF generator 718 provides RF power in one, two, or three different RF frequencies. According to the desired configuration of the chamber 700 for a particular operation, at least one of the three RF frequencies may be turned on or off. In the embodiment shown in FIG. 7, RF generator 718 provides 2 MHz, 27 MHz, and 60 MHz frequencies, but other frequencies are also possible.

The chamber 700 includes a gas showerhead on the top electrode 704 to input gas into the chamber 700 provided by gas source(s) 722, and a perforated confinement ring 712 that allows the gas to be pumped out of the chamber 700 by gas pump 720. In some example embodiments, the gas pump 720 is a turbomolecular pump, but other types of gas pumps may be utilized.

When substrate 706 is present in the chamber 700, silicon focus ring 710 is situated next to the substrate 706 such that there is a uniform RF field at the bottom surface of the plasma 702 for uniform etching on the surface of the substrate 706. The embodiment of FIG. 7 shows a triode reactor configuration where the top electrode 704 is surrounded by a symmetric RF ground electrode 724. Insulator 726 is a dielectric that isolates ground electrode 724 from top electrode 704.

Each frequency may be selected for a specific purpose in the wafer manufacturing process. In the example of FIG. 7, with RF powers provided at 2 MHz, 27 MHz, and 60 MHz, the 2 MHz RF power provides ion energy control, and the 27 MHz and 60 MHz powers provide control of the plasma density and the dissociation patterns of the chemistry. This configuration, where each RF power may be turned on or off, enables certain processes that use ultra-low ion energy on the substrates or wafers, and certain processes (e.g., soft etch for low-k materials) where the ion energy has to be low (under 700 or 200 eV).

In another embodiment, a 60 MHz RF power is used on the top electrode 704 to get ultra-low energies and very high density. This configuration allows chamber cleaning with high density plasma when the substrate 706 is not in the chamber 700, while minimizing sputtering on the electro static chuck (ESC) surface. The ESC surface is exposed when the substrate 706 is not present, and any ion energy on the surface should be avoided, which is why the bottom 2 MHz and 27 MHz power supplies may be off during cleaning.

Figure 8:
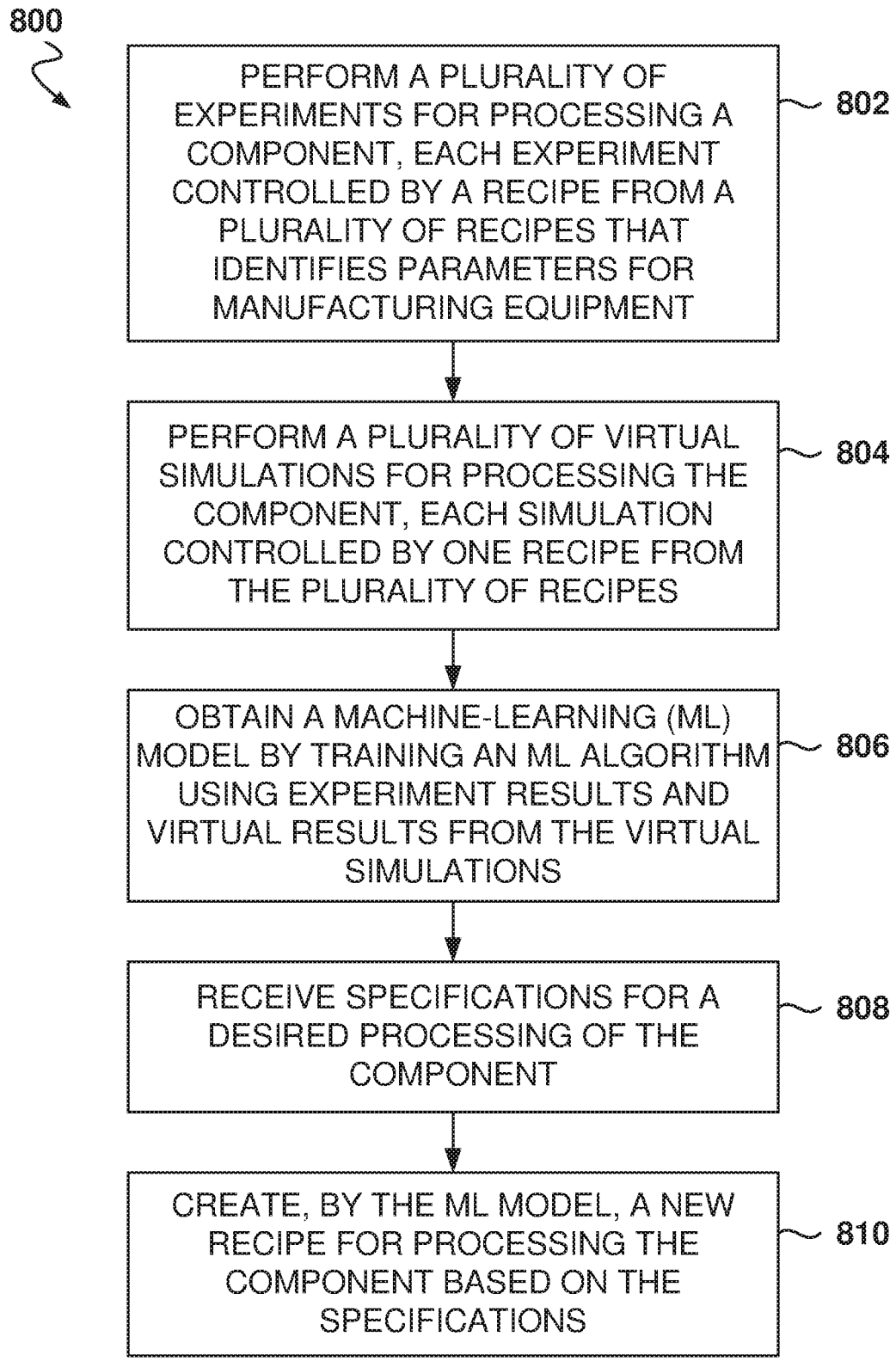
FIG. 8 is a flowchart of a method for determining the recipe for manufacturing a semiconductor, according to some example embodiments.

FIG. 8 is a flowchart of a method 800 for determining the recipe for semiconductor manufacturing, according to some example embodiments. While the various operations in this flowchart are presented and described sequentially, one of ordinary skill will appreciate that some or all of the operations may be executed in a different order, be combined or omitted, or be executed in parallel.

At operation 802, a plurality of experiments for processing a component are performed. Each experiment is controlled by a recipe from a plurality of recipes that identifies parameters for manufacturing equipment.

From operation 802, the method 800 flows to operation 804 for performing a plurality of virtual simulations for processing the component. Each simulation is controlled by one recipe from the plurality of recipes.

From operation 804, the method 800 flows to operation 806, where an ML model is obtained by training an ML algorithm using experiment results and virtual results from the virtual simulations.

From operation 806, the method 800 flows to operation 808 for receiving specifications for a desired processing of the component. At operation 810, the ML model creates a new recipe for processing the component based on the specifications.

In one example, the ML model is based on a plurality of features that comprise recipe features, experiment results features, virtual result features, and metrology features.

In one example, the metrology features include one or more of imaging methods, transmission electron microscopy, typical-thickness measurement, sheet resistance, surface resistivity, stress measurement, and analytical methods used to determine layer thickness, composition, grain, or orientation.

In one example, the recipe features include workflow, gas flows, chamber temperature, chamber pressure, step durations, and radiofrequency (RF) values.

In one example, the virtual simulations are performed by a simulation tool based on behavior modeling.

In one example, the experiment results include values measured from the processing of the component, the values including one or more of lateral ratio, isotropic ratio, deposition depth, global sticking coefficient, surface dependent sticking coefficient, delay thickness, neutral-to-ion ratio, and ion angular distribution function.

In one example, each experiment is performed on a semiconductor manufacturing apparatus based on the recipe for the experiment, wherein one experiment is performed to measure effects of changing a value of one parameter from a previous recipe used in a previous experiment.

In one example, the processing of the component is for a deposition process using an inhibition profile.

In one example, the processing of the component is for a deposition in a 3D NAND word line (WL) fill.

Another general aspect is for a system that includes a memory comprising instructions and one or more computer processors. The instructions, when executed by the one or more computer processors, cause the one or more computer processors to perform operations comprising: performing a plurality of experiments for processing a component, each experiment controlled by a recipe from a plurality of recipes that identifies parameters for manufacturing equipment; performing a plurality of virtual simulations for processing the component, each simulation controlled by one recipe from the plurality of recipes; obtaining a machine-learning (ML) model by training an ML algorithm using experiment results and virtual results from the virtual simulations; receiving specifications for a desired processing of the component; and creating, by the ML model, a new recipe for processing the component based on the specifications.

In yet another general aspect, a machine-readable storage medium (e.g., a non-transitory storage medium) includes instructions that, when executed by a machine, cause the machine to perform operations comprising: performing a plurality of experiments for processing a component, each experiment controlled by a recipe from a plurality of recipes that identifies parameters for manufacturing equipment; performing a plurality of virtual simulations for processing the component, each simulation controlled by one recipe from the plurality of recipes; obtaining a machine-learning (ML) model by training an ML algorithm using experiment results and virtual results from the virtual simulations; receiving specifications for a desired processing of the component; and creating, by the ML model, a new recipe for processing the component based on the specifications.

Figure 9:
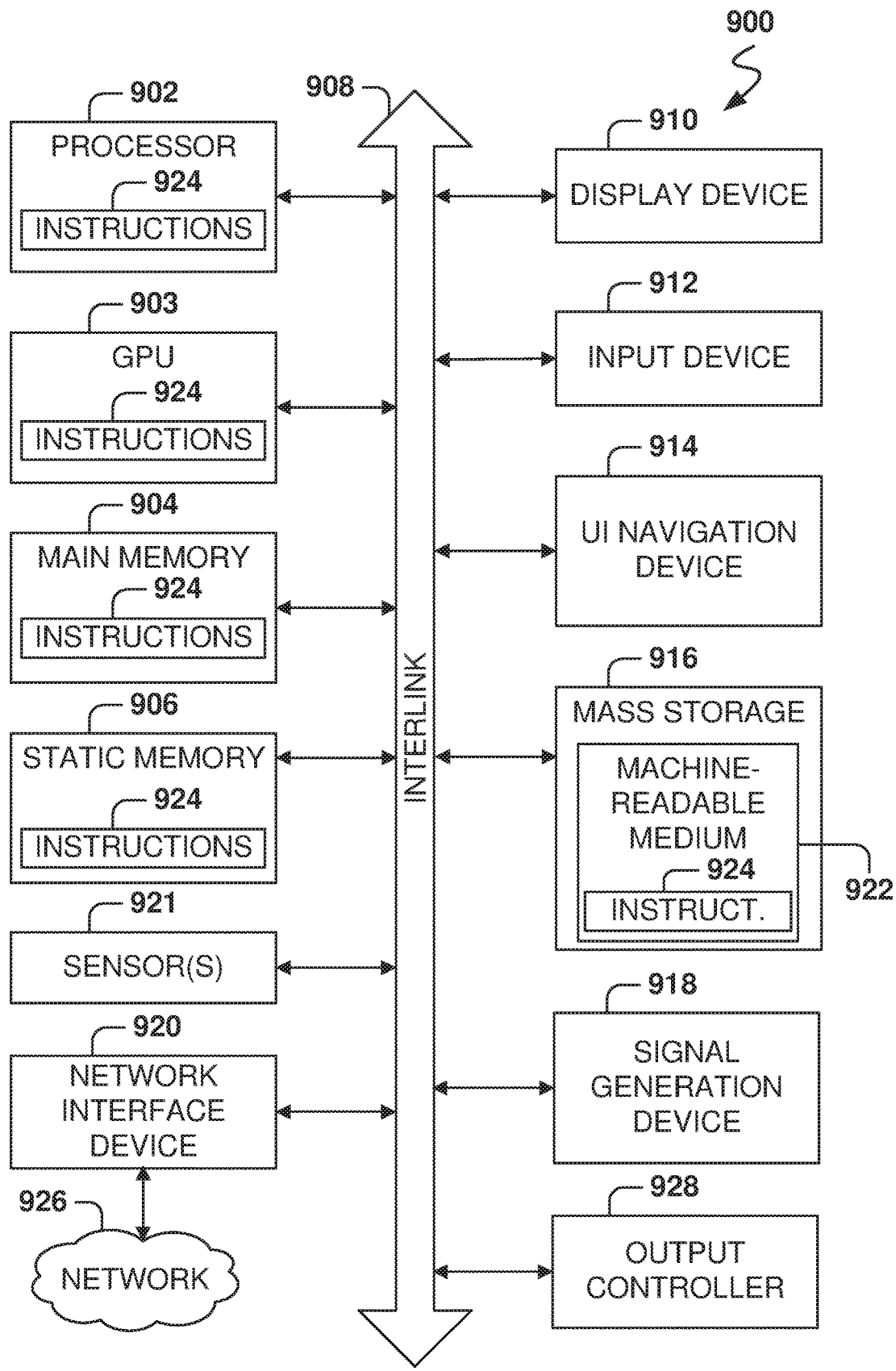
FIG. 9 is a block diagram illustrating an example of a machine upon or by which one or more example process embodiments described herein may be implemented or controlled.

FIG. 9 is a block diagram illustrating an example of a machine 900 upon or by which one or more example process embodiments described herein may be implemented or controlled. In alternative embodiments, the machine 900 may operate as a standalone device or may be connected (e.g., networked) to other machines. In a networked deployment, the machine 900 may operate in the capacity of a server machine, a client machine, or both in server-client network environments. In an example, the machine 900 may act as a peer machine in a peer-to-peer (P2P) (or other distributed) network environment. Further, while only a single machine 900 is illustrated, the term "machine" shall also be taken to include any collection of machines that individually or jointly execute a set (or multiple sets) of instructions to perform any one or more of the methodologies discussed herein, such as via cloud computing, software as a service (SaaS), or other computer cluster configurations.

Examples, as described herein, may include, or may operate by, logic, a number of components, or mechanisms. Circuitry is a collection of circuits implemented in tangible entities that include hardware (e.g., simple circuits, gates, logic). Circuitry membership may be flexible over time and underlying hardware variability. Circuitries include members that may, alone or in combination, perform specified operations when operating. In an example, hardware of the circuitry may be immutably designed to carry out a specific operation (e.g., hardwired). In an example, the hardware of the circuitry may include variably connected physical components (e.g., execution units, transistors, simple circuits) including a computer-readable medium physically modified (e.g., magnetically, electrically, by moveable placement of invariant massed particles) to encode instructions of the specific operation. In connecting the physical components, the underlying electrical properties of a hardware constituent are changed (for example, from an insulator to a conductor or vice versa). The instructions enable embedded hardware (e.g., the execution units or a loading mechanism) to create members of the circuitry in hardware via the variable connections to carry out portions of the specific operation when in operation. Accordingly, the computer-readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry, at a different time.

The machine (e.g., computer system) 900 may include a hardware processor 902 (e.g., a central processing unit (CPU), a hardware processor core, or any combination thereof), a graphics processing unit (GPU) 903, a main memory 904, and a static memory 906, some or all of which may communicate with each other via an interlink (e.g., bus) 908. The machine 900 may further include a display device 910, an alphanumeric input device 912 (e.g., a keyboard), and a user interface (UI) navigation device 914 (e.g., a mouse). In an example, the display device 910, alphanumeric input device 912, and UI navigation device 914 may be a touch screen display. The machine 900 may additionally include a mass storage device (e.g., drive unit) 916, a signal generation device 918 (e.g., a speaker), a network interface device 920, and one or more sensors 921, such as a Global Positioning System (GPS) sensor, compass, accelerometer, or another sensor. The machine 900 may include an output controller 928, such as a serial (e.g., universal serial bus (USB)), parallel, or other wired or wireless (e.g., infrared (IR), near field communication (NFC)) connection to communicate with or control one or more peripheral devices (e.g., a printer, card reader).

The mass storage device 916 may include a machine-readable medium 922 on which is stored one or more sets of data structures or instructions 924 (e.g., software) embodying or utilized by any one or more of the techniques or functions described herein. The instructions 924 may also reside, completely or at least partially, within the main memory 904, within the static memory 906, within the hardware processor 902, or within the GPU 903 during execution thereof by the machine 900. In an example, one or any combination of the hardware processor 902, the GPU 903, the main memory 904, the static memory 906, or the mass storage device 916 may constitute machine-readable media.

While the machine-readable medium 922 is illustrated as a single medium, the term "machine-readable medium" may include a single medium, or multiple media, (e.g., a centralized or distributed database, and/or associated caches and servers) configured to store the one or more instructions 924.

The term "machine-readable medium" may include any medium that is capable of storing, encoding, or carrying instructions 924 for execution by the machine 900 and that cause the machine 900 to perform any one or more of the techniques of the present disclosure, or that is capable of storing, encoding, or carrying data structures used by or associated with such instructions 924. Non-limiting machine-readable medium examples may include solid-state memories, and optical and magnetic media. In an example, a massed machine-readable medium comprises a machine-readable medium 922 with a plurality of particles having invariant (e.g., rest) mass. Accordingly, massed machine-readable media are not transitory propagating signals. Specific examples of massed machine-readable media may include non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 924 may further be transmitted or received over a communications network 926 using a transmission medium via the network interface device 920.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. Moreover, plural instances may be provided for resources, operations, or structures described herein as a single instance. Additionally, boundaries between various resources, operations, modules, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

What is claimed is:

1. A method comprising:
performing a plurality of experiments for processing and forming a semiconductor device, each experiment controlled by a semiconductor device process recipe from a plurality of semiconductor device process recipes that identifies parameters for manufacturing equipment used for the processing of the semiconductor device;
performing a plurality of virtual simulations for processing the semiconductor device, each virtual simulation controlled by one semiconductor device process recipe from the plurality of semiconductor device process recipes;
obtaining a machine-learning (ML) model by training an ML algorithm using experiment results and virtual results from the plurality of virtual simulations;
receiving specifications for a desired processing of the semiconductor device; and
creating, by the ML model, a new recipe for processing the semiconductor device based on the specifications.

2. The method as recited in claim 1, wherein the ML model is based on a plurality of features that comprise recipe features, experiment results features, virtual result features, and metrology features.

3. The method as recited in claim 2, wherein the metrology features include one or more of imaging methods, transmission electron microscopy, typical-thickness measurement, sheet resistance, surface resistivity, stress measurement, and analytical methods used to determine at least one characteristic selected from characteristics including layer thickness, composition, grain, and orientation.

4. The method as recited in claim 2, wherein the recipe features include workflow, gas flows, chamber temperature, chamber pressure, step durations, and radio-frequency (RF) values.

5. The method as recited in claim 2, wherein the ML model includes active process control to determine process parameters to satisfy control objectives, the input to the ML model including the control objectives for the recipe and desired active process control.

6. The method as recited in claim 1, wherein the virtual simulations are performed by a simulation tool based on behavior modeling.

7. The method as recited in claim 1, wherein the experiment results include values measured from the processing of the component, the values including one or more of lateral ratio, isotropic ratio, deposition depth, global sticking coefficient, surface dependent sticking coefficient, delay thickness, neutral-to-ion ratio, and ion angular distribution function.

8. The method as recited in claim 1, wherein each experiment is performed on a semiconductor manufacturing apparatus based on the recipe for the experiment, wherein one experiment is performed to measure effects of changing a value of one parameter from a previous recipe used in a previous experiment.

9. The method as recited in claim 1, wherein the processing the component is for a deposition process using an inhibition profile.

10. The method as recited in claim 1, wherein the processing the component is for a deposition in a 3D NAND word line (WL) fill.

11. A system comprising:
a memory comprising instructions; and
one or more computer processors, the instructions, when executed by the one or more computer processors, cause the system to perform operations comprising:
performing a plurality of experiments for processing and forming a semiconductor device, each experiment controlled by a semiconductor device process recipe from a plurality of semiconductor device process recipes that identifies parameters for manufacturing equipment used for the processing of the semiconductor device;
performing a plurality of virtual simulations for processing the semiconductor device, each virtual simulation controlled by one semiconductor device process recipe from the plurality of semiconductor device process recipes;
obtaining a machine-learning (ML) model by training an ML algorithm using experiment results and virtual results from the plurality of virtual simulations;
receiving specifications for a desired processing of the semiconductor device; and
creating, by the ML model, a new recipe for processing the semiconductor device based on the specifications.

12. The system as recited in claim 11, wherein the ML model is based on a plurality of features that comprise recipe features, experiment results features, virtual result features, and metrology features.

13. The system as recited in claim 12, wherein the metrology features include one or more of imaging methods, transmission electron microscopy, typical-thickness measurement, sheet resistance, surface resistivity, stress measurement, and analytical methods used to determine at least one characteristic selected from characteristics including layer thickness, composition, grain, and orientation.

14. The system as recited in claim 12, wherein the recipe features include workflow, gas flows, chamber temperature, chamber pressure, step durations, and radio-frequency (RF) values.

15. The system as recited in claim 11, wherein the experiment results include values measured from the processing of the component, the values including one or more of lateral ratio, isotropic ratio, deposition depth, global sticking coefficient, surface dependent sticking coefficient, delay thickness, neutral-to-ion ratio, and ion angular distribution function.

16. The system as recited in claim 11, wherein each experiment is performed on a semiconductor manufacturing apparatus based on the recipe for the experiment, wherein one experiment is performed to measure effects of changing a value of one parameter from a previous recipe used in a previous experiment.

17. A tangible machine-readable storage medium including instructions that, when executed by a machine, cause the machine to perform operations comprising:
performing a plurality of experiments for processing and forming a semiconductor device, each experiment controlled by a semiconductor device process recipe from a plurality of semiconductor device process recipes that identifies parameters for manufacturing equipment used for the processing of the semiconductor device;
performing a plurality of virtual simulations for processing the semiconductor device, each virtual simulation controlled by one semiconductor device process recipe from the plurality of semiconductor device process recipes;
obtaining a machine-learning (ML) model by training an ML algorithm using experiment results and virtual results from the plurality of virtual simulations;
receiving specifications for a desired processing of the semiconductor device; and
creating, by the ML model, a new recipe for processing the semiconductor device based on the specifications.

18. The tangible machine-readable storage medium as recited in claim 17, wherein the ML model is based on a plurality of features that comprise recipe features, experiment results features, virtual result features, and metrology features.

19. The tangible machine-readable storage medium as recited in claim 18, wherein the metrology features include one or more of imaging methods, transmission electron microscopy, typical-thickness measurement, sheet resistance, surface resistivity, stress measurement, and analytical methods used to determine at least one characteristic selected from characteristics including layer thickness, composition, grain, and orientation.

20. The tangible machine-readable storage medium as recited in claim 18, wherein the recipe features include workflow, gas flows, chamber temperature, chamber pressure, step durations, and radio-frequency (RF) values.

21. The tangible machine-readable storage medium as recited in claim 17, wherein the experiment results include values measured from the processing of the component, the values including one or more of lateral ratio, isotropic ratio, deposition depth, global sticking coefficient, surface dependent sticking coefficient, delay thickness, neutral-to-ion ratio, and ion angular distribution function.

* * * * *